US007125260B2

(12) United States Patent
Orita et al.

(10) Patent No.: US 7,125,260 B2
(45) Date of Patent: Oct. 24, 2006

(54) MOUNTING STRUCTURE OF CONNECTOR

(75) Inventors: Katsuyoshi Orita, Shinagawa-ku (JP); Keiji Kawaguchi, Shinagawa-ku (JP); Takashi Miyajima, Ota-ku (JP); Satoru Teruki, Ota-ku (JP)

(73) Assignees: Taiko Denki Co., Ltd., Toyko (JP); Sony Corporation, Tokyo (JP)

( * ) Notice: Subject to any disclaimer, the term of this patent is extended or adjusted under 35 U.S.C. 154(b) by 0 days.

(21) Appl. No.: 11/255,894

(22) Filed: Oct. 20, 2005

(65) Prior Publication Data

US 2006/0089018 A1 Apr. 27, 2006

(30) Foreign Application Priority Data

Oct. 21, 2004 (JP) ............................ 2004-306861

(51) Int. Cl.
*H01R 12/00* (2006.01)
*H05K 1/14* (2006.01)

(52) U.S. Cl. ........................................ 439/74; 439/247

(58) Field of Classification Search .................. 439/74, 439/247, 248, 107, 108
See application file for complete search history.

(56) References Cited

U.S. PATENT DOCUMENTS 3,651,444 A * 3/1972 Desso et al. ................ 439/141
5,201,663 A * 4/1993 Kikuchi et al. ............... 439/83
5,556,286 A * 9/1996 Ikesugi et al. ................ 439/74
5,984,722 A 11/1999 Ito
6,155,858 A * 12/2000 Ozawa et al. ............... 439/248
6,338,635 B1 * 1/2002 Lee ............................ 439/108
6,592,407 B1 * 7/2003 Korunsky et al. .......... 439/637
6,648,657 B1 * 11/2003 Korsunsky et al. ......... 439/108

FOREIGN PATENT DOCUMENTS

JP 3047965 2/1998
JP 11-251010 9/1999

* cited by examiner

*Primary Examiner*—James R. Harvey
(74) *Attorney, Agent, or Firm*—McCormick, Paulding & Huber LLP

(57) ABSTRACT

A connector mounting structure on a circuit board is presented. A connector has a plurality of terminals comprising first terminals separated with a predetermined pitch and second terminals separated with a pitch larger than the predetermined pitch. The first and second terminals have respectively a first tail part facing toward the circuit board and a second tail part bent toward the circuit board after extending in the lateral direction from the connector housing. The first tail part is reflow-soldered to a land part formed on a surface of the circuit board, and the bent top end of the second tail part is inserted into a mounting hole penetrating another land part formed on the circuit board and reflow-soldered. In this mounting structure of the connector, it is simultaneously possible to narrow a pitch between terminals and to increase the peeling strength.

10 Claims, 4 Drawing Sheets

MOUNTING STRUCTURE OF CONNECTOR

DESCRIPTION OF RELATED APPLICATIONS

The present application claims the benefit of Japanese Patent Application No. 2004-306861 (filed on 21, Oct. 2004) and the content of the above-described application is described in the specification of the present application.

BACKGROUND OF THE INVENTION

1. Field of the Invention

The present invention relates to a mounting structure for mounting a connector comprising a plurality of terminals on a circuit board.

2. Description of the Related Art

A connector generally comprises a connector housing comprising insulating materials and a plurality of terminals, which are arranged in the connector housing and composed of electrically conductive materials. The connector is mounted on the circuit board by soldering a tail part of the terminal to a predetermined position of the circuit board, and is electrically connected with a wiring pattern of the circuit board. Such a connector is electrically connected with other electronic appliances, parts or the like by incorporating a counterpart connector that fits into the connector, by being connected with a flat cable, a coaxial cable or the like, or in other ways.

As a method for soldering and fixing the connector to the circuit board, one of the most popular methods is a surface mounting type (a surface mount technology/method) and another is a dip type (a dipping method).

As for the surface mounting type, the tail part of the terminal of the connector is reflow-soldered to a predetermined position of the circuit board, that is, to a land part connected with the wiring pattern printed on the surface of the circuit board. On the other hand, as for the dip type, the other land part similar to the land part described above is prepared on the back surface of the circuit board, and a mounting hole for penetrating the circuit board is formed at the position of the land part. The tail part of the terminal of the connector is penetrated to the mounting hole from the front surface to the back surface of the circuit board, and the back surface of the circuit board is dipped in a dipping vessel (a dipping tub) where a fused solder is stored. Then, the terminal is soldered to the other land part.

When the surface mounting type and the dip type are compared, the advantageous point of the surface mounting type is as follows. That is, since it is not necessary to prepare the dipping vessel, it is easier and lower in cost than the dipping type. Further, in the dip type, since the mounting hole must be provided in the circuit board, the narrowed pitch between the terminals of the connector is limited to a pitch where the mounting holes do not make contact with each other. On the other hand, in the surface mounting type, since it is not necessary to provide the mounting hole in the circuit board, the pitch between the terminals can be easily narrowed, and thereby it is possible to promote the miniaturization of the connector, consequently, the miniaturization of the electrical appliance.

On the contrary, the advantageous point of the dip type is as follows. That is, in the surface mounting type, since only the tail part of the terminal is adhered to the surface of the circuit board by the solder, the contacting area is small, and it is difficult to satisfy the peeling strength from the circuit board. On the other hand, in the dip type, the terminal is penetrated to the back surface of the circuit board through the mounting hole, and is soldered under this condition. Thus, the contacting area is large, and the solder is penetrated into the mounting hole, so that the peeling strength is remarkably increased.

Therefore, for example, as disclosed in Japanese Patent Laid-Open Publication No. H11-251010 (laid-opened on 17 Sep., 1999), the surface mounting type is adopted when a connector has a comparatively small height and is used in the fields where a large stress is not generated at the time of connecting and disconnecting of a counterpart connector, a flat cable, a coaxial cable or the like, which is mounted on another electrical appliance or part. Conversely, the dip type is adopted, for example, when the connector has a comparatively tall height in the case where the large stress is generated at the time of connecting and disconnecting of the counterpart connector, or in the case where the connector is frequently connected and disconnected, as disclosed in Japanese Utility Model Registration No. 3047965 (published on 28 Apr., 1998).

In other words, when using the surface mounting type or using the dip type, both cases have had problems, which have been tolerated in the past. That is, when the surface mounting type is used, the pitch between the terminals can be narrowed, but the peeling strength is decreased. On the other hand, when the dip type is used, the peeling strength is increased, but the pitch between the terminals becomes large.

However, since today's market needs are matched with the background for miniaturization of electrical appliances, it is required that the mounting structure of a connector comprises a terminal having narrower and higher density pitches and an arrangement to be mounted on the circuit board at a small mounting area with the high peeling strength.

SUMMARY OF THE INVENTION

The objective of the present invention is to provide a mounting structure of a connector capable of both narrowing a pitch between terminals and increasing the peeling strength.

In order to satisfy the above objective, the present invention is the mounting structure for mounting the connector on a circuit board. The connector has a plurality of terminals arranged in a connector housing. The plurality of terminals includes first terminals separated with a predetermined pitch and second terminals separated with a pitch larger than the predetermined pitch. Each first terminal has a first tail part faced toward the circuit board, and each second terminal has a second tail part, which is bent toward the circuit board after extending from the lateral side of the connector housing. The first tail part is reflow-soldered to a land part formed on a surface of the circuit board. A part of a bent top end of the second tail part is inserted into a mounting hole penetrating another land part formed on the surface of the circuit board, and is reflow-soldered to that other land part.

According to the present invention, the first tail part is reflow-soldered to the land part of the surface of the circuit board. Thus, when the width of the land part itself and/or the pitch between the land parts are narrowed, the pitch of the first terminal can be narrowed. Further, the part of the bent top end of the second tail part is inserted into the mounting hole penetrating the other land part formed on the surface of the circuit board and is reflow-soldered to the other land part. Thus, a large adhesion area can be secured, and the solder penetrates into the mounting hole, to thereby increase the peeling strength. As mentioned above, as the whole connector, the objective to narrow the pitch between the terminals and also to increase the peeling strength can be realized.

In addition, because the first and the second tail parts are fixed to each land part on the surface of the circuit board by reflow-soldering, the connector comes to be mounted on the circuit board by the surface mounting type as a whole, and that can make mounting easier-to-use as well as lower in cost comparing to the case of adopting the dip type.

The second tail part may be extended from the lateral side of the connector housing beyond the first tail part.

Thereby, the position of the mounting hole formed at the circuit board is displaced to the lateral side from the position of the land part, which is formed at the circuit board, so as to make contact with the first tail part, where the mounting hole is formed in order to receive the bent part of the second tail part. Thus, the mounting hole does not prevent the pitches of the first terminal and the second terminal from being narrowed, so that the narrowing of the pitches in the first terminal and the second terminal can be promoted.

Furthermore, the first terminals and the second terminals may each be arranged in pairs across the width direction of the connector housing.

Thereby, the mounting width of one pair of second tail parts on the circuit board (the mounting width in the width direction of the connector housing) is larger than the mounting width of one pair of first tail parts on the circuit board. Thus, when jolt, or lateral force, is added to the connector housing, a large resistance moment can be exerted by the second tail parts, which resistance moment together with the insertion of the bent part of each second tail part into the mounting hole of the circuit board, increases the peeling strength.

The first terminal is a signal terminal, and the second terminal may be a terminal other than the signal terminal.

Thereby, since the number of the signal terminal is generally larger than that of the terminal other than the signal terminal, the signal terminal having a large number of terminals is positioned at the inside of the tail parts of the terminal having a small number of terminals other than the signal terminal, to thereby enables decreasing the mounting area as small as possible.

The connector housing may be a socket housing and/or plug housing of a board-to-board type connector.

Thereby, the above effects can be exerted to the board-to-board type connector where a large stress is susceptible to be generated when connecting and disconnecting.

The connector housing has an outside housing, which is formed to have a frame shape, and an inside housing arranged in an inner side of the outside housing. The inside housing may be supported in a floating state with the outside housing through the first terminal and the second terminal.

By being supported in a floating state in this way, a positional error of the connector with respect to the board at mounting can be tolerated.

DETAILED DESCRIPTION OF THE INVENTION

A preferred embodiment of the present invention will be described with reference to the drawings.

Figure 1:
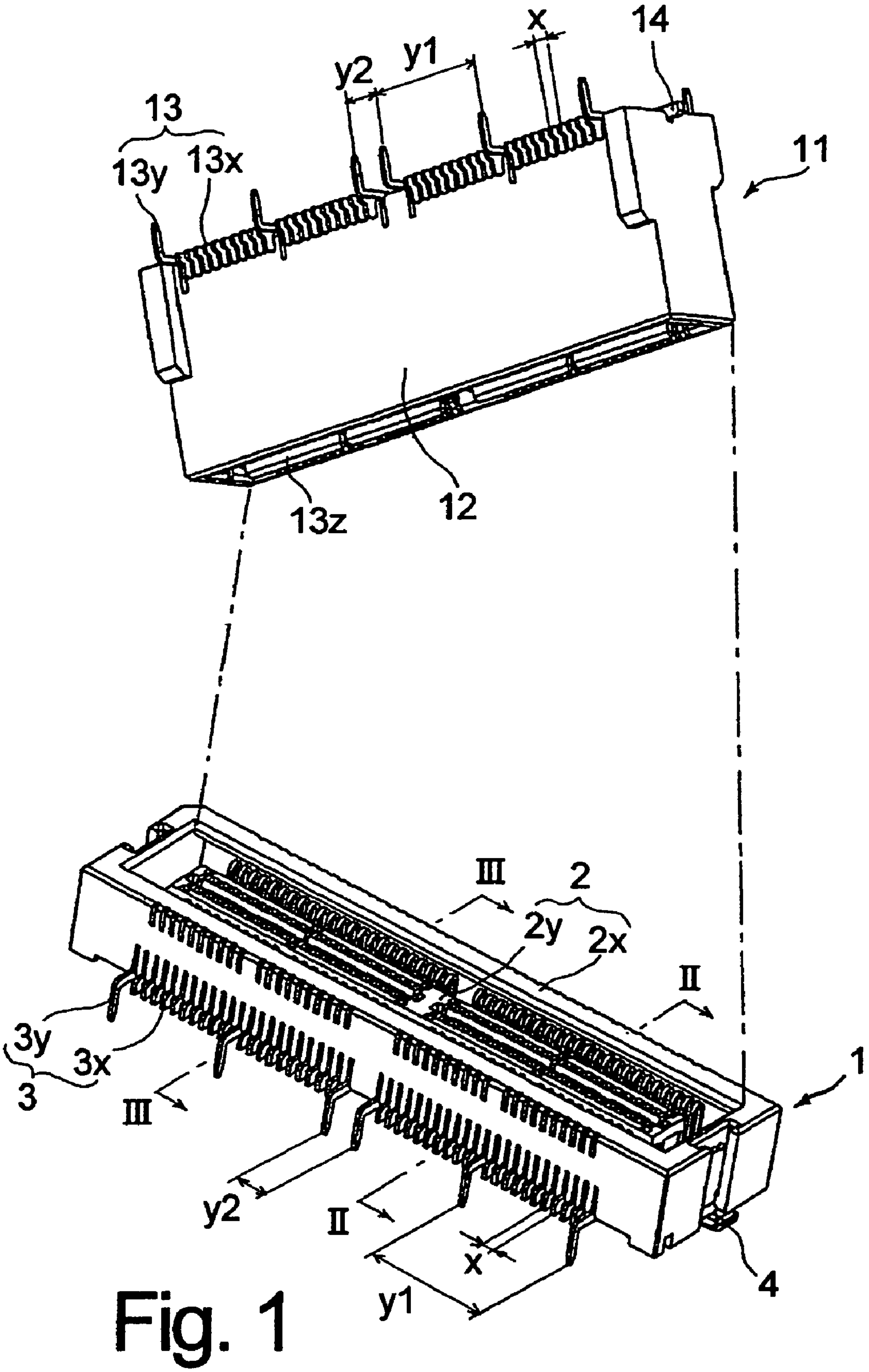
FIG. 1 is a perspective view of a board-to-board type connector according to the present embodiment, and an upper part shows a plug, while a lower part shows a socket.

FIG. 1 illustrates an embodiment where the present invention is applied to a board-to-board type connector. This connector consists of a plug 11 mounted on one circuit board and a socket 1 mounted on the other circuit board. By fitting the plug 11 into the socket 1, both circuit boards are electrically connected.

First, the socket will be described using FIGS. 1, 2 and 3.

The socket 1 is to be mounted on a circuit board B1, and has a socket housing 2 as a connector housing, and a plurality of socket terminals 3 arranged in the socket housing 2. The socket housing 2 consists of an outside housing 2*x* formed to have a frame shape and an inside housing 2*y* arranged in an inner side of the outside housing 2*x*. The inside housing 2*y* is supported in the foaling state with the outside housing 2*x* through the socket terminals 3.

The socket terminals 3 include socket first terminals 3*x* (hereinafter, referred to as signal terminals), and socket second terminals 3*y* (hereinafter, referred to as earth terminals), where the socket first terminals 3*x* are arranged with a predetermined pitch x (for example, 0.6 mm) In the longitudinal direction of the socket housing 2 and the socket second terminals 3*y* are arranged with pitches y1 and y2 which are larger than the above-described pitch x. There are 10 signal terminals 3*x* between 2 earth terminals 3*y*, and the pitch y1 between the 2 earth terminals 3*y* is arranged to be 0.6×11=6.6 mm. Further, the pitch y2 between terminals 3*y*, where no signal terminal 3*x* is inserted in between, is arranged to be 2.0 mm.

In addition, the above values (0.6 mm, 10 terminals, 6.6 mm, 2.0 mm) are examples, and other values may be used. Further, a metal fitting 4 for soldering the outside housing 2*x* to the circuit board B1 is provided at the both end parts of the outside housing 2*x* in the longitudinal direction.

Figure 2:
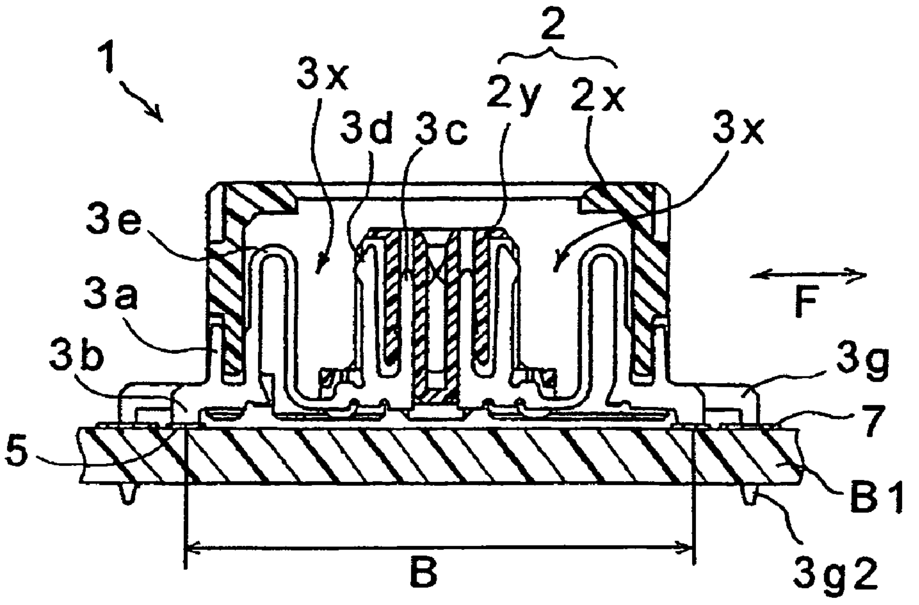
FIG. 2 is a cross-sectional view taken along line II—II in FIG. 1.

As illustrated in FIG. 2, two signal terminals 3*x* are arranged to form a pair (2 terminals), symmetrically in the width direction of the socket housing 2. Each signal terminal 3*x* comprises an outside fixing part 3*a* which is press fitted into a groove formed at the outside housing 2*x*, a tail part 3*b* (hereinafter, referred to as the first tail part 3*b*) which is extended in the lateral direction from the lower end of the outside fixing part 3*a* so as to face toward the circuit board B1, an inside fixing part 3*c* which is press fitted into the groove formed at the inside housing 2*y*, a contacting part 3*d* which is extended in the upper direction from the lower part of the inside fixing part 3*c*, and a displacement absorbing part 3*e* which is formed in a mountain-like shape (an inverted U shape) between the outside fixing part: 3*a* and the inside fixing part 3*c*.

The first tail part 3*b* is to be reflow-soldered to a land part 5 connected with a wiring pattern printed on the surface of the circuit board B1. The contacting part 3*d* contacts with a contacting part 13*c* (cf. FIG. 4) of a signal terminal 13*x* on the plug 11 side described below, when a plug 11 is fitted into the socket 1 illustrated in FIG. 1. As for the displacement absorbing part 3*e*, when the plug 11 is fitted into the socket 1, it is arranged between the outside housing 2*x* and the inside housing 2*y* in order not to prevent the fitting.

Further, when being fitted, the displacement absorbing part 3*e* permits a displacement of the inside housing 2*y* with respect to the outside housing 2*x* (support in the floating state).

Figure 3:
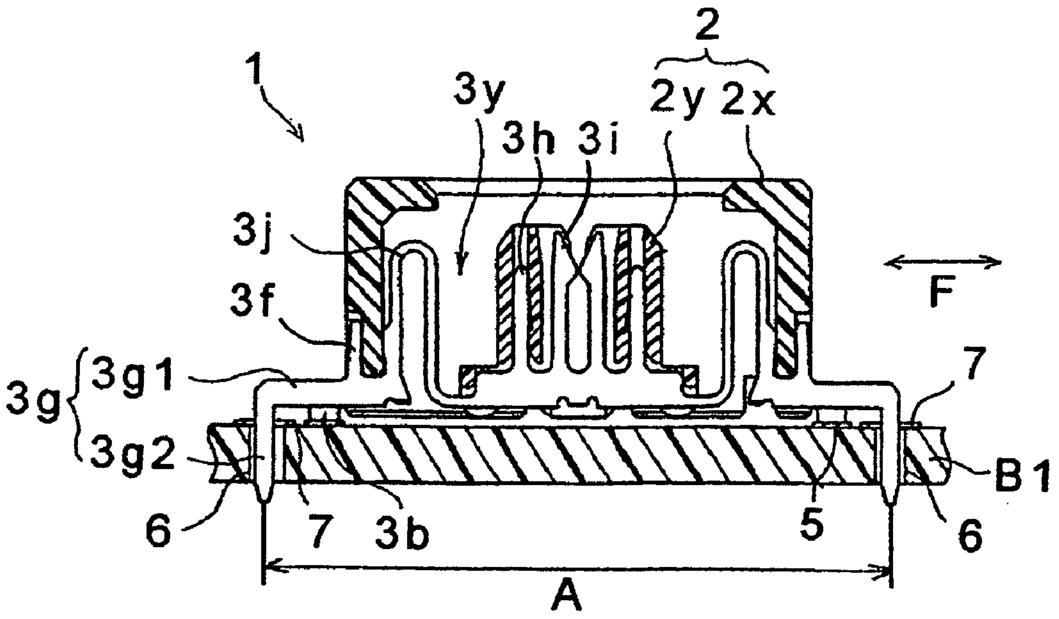
FIG. 3 is a cross-sectional view taken along line III—III in FIG. 1.

As illustrated in FIG. 3, two earth terminals 3*y* are integrally and symmetrically formed in the width direction of the socket housing 2. Each earth terminal 3*y* comprises an outside fixing part 3*f* which is press fitted into a groove formed at the outside housing 2*x*, a tail part 3*g* (hereinafter, referred to as the second tail part 3*g*) which is bent to the circuit board B1 side after extending to the lateral direction from the lower end of the outside fixing part 3*f*, an inside fixing part 3*h* which is press fitted into a groove formed at the inside housing 2*y*, a contacting part 3*i* which is extended in the upper direction from the lower part of the inside fixing part 3*h*, and a displacement absorbing part 3*j* which is formed in a mountain-like shape (an inverted U shape) between the outside fixing part 3*f* and the inside fixing part 3*h*.

The second tail part 3*g* comprises an extending portion 3*g*1 which is extended to the lateral direction from the outside housing 2*x* beyond the first tail part 3*b* of the signal terminal 3*x* and a leg portion 3*g*2 which is formed so as to be bent toward the circuit board B1 side from the top end of the extending portion 3*g*1. The leg portion 3*g*2 is inserted into a mounting hole 6 formed on the circuit board B1 and reflow-soldered to another land part 7 formed on the surface of the circuit board B1. The other land part 7 is formed on the surface of the circuit board B1 surrounding the mounting hole 6.

The contacting part 3*i* makes contact with an earth plate 13*z* (cf. FIG. 5) on the plug 11 side described below when the plug 11 is fitted into the socket 1 as illustrated in FIG. 1. When the plug 11 is fitted into the socket 1, the displacement absorbing part 3*j* is arranged between the outside housing 2*x* and the inside housing 2*y* in order not to prevent the fitting. Further, when being fitted, the displacement absorbing part 3*j* permits a displacement of the inside housing 2*y* with respect to the outside housing 2*x* (support in the floating state).

Then, the plug will be described using FIGS. 1, and 4 to 6.

The plug 11 is mounted on a circuit board B2, which is different from the circuit board B1 on which the socket 1 is mounted. The plug 11 has a plug housing 12 as a connector housing and a plurality of plug terminals 13 arranged in the plug housing 12. These plug terminals 13 are directly mounted on the plug housing 12.

The plug terminals 13 include plug first terminals 13*x* (hereinafter, referred to as signal terminals) which are arranged with a predetermined pitch x (for example, 0.6 mm) in the longitudinal direction of the plug housing 12, plug second terminals 13*y* (hereinafter, referred to as earth terminals) which are arranged with pitches y1 and y2 larger than the above-described pitch x, and earth plates 13*z* which make contact with the earth terminals 13*y*.

Figure 6:
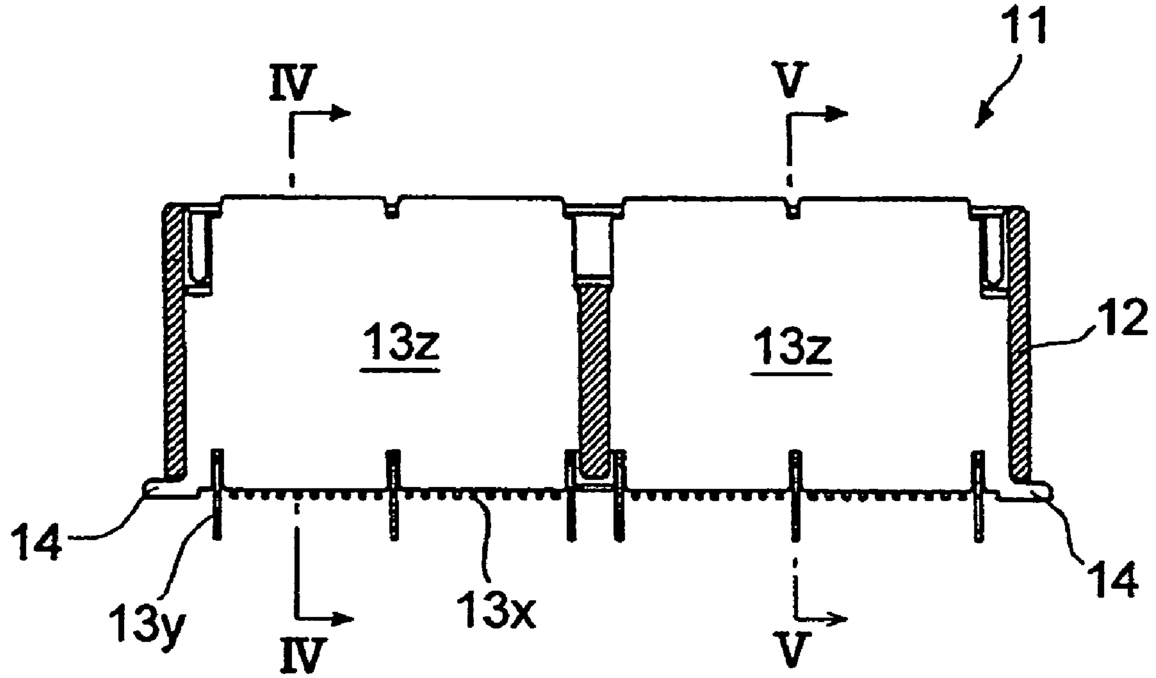
FIG. 6 is a cross-sectional view in the longitudinal direction of the plug illustrated in FIG. 1.

In the plug, 10 signal terminals 13*x* are sandwiched between 2 earth terminals 13*y*, and the pitch y1 between the 2 earth terminals 13*y* is arranged to be 0.6×11=6.6 mm. Further, the pitch y2 between 2 earth terminals 13*y*, where no signal terminal 13*x* is inserted in between, is arranged to be 2.0 mm. As for the earth plates 13*z*, as illustrated in FIG. 6, two earth plates 13*z* are arranged to have a predetermined interval shown in the figure, but they may be integrated. At the end part of the earth plate 13*z*, a tail part 14 is formed for soldering to the circuit board B2.

In addition, the above values (0.6 mm, 10 terminals, 6.6 mm, 2.0 mm) are examples, and other values may be used, if these are consistent with the values on the socket 1 side.

Figure 4:
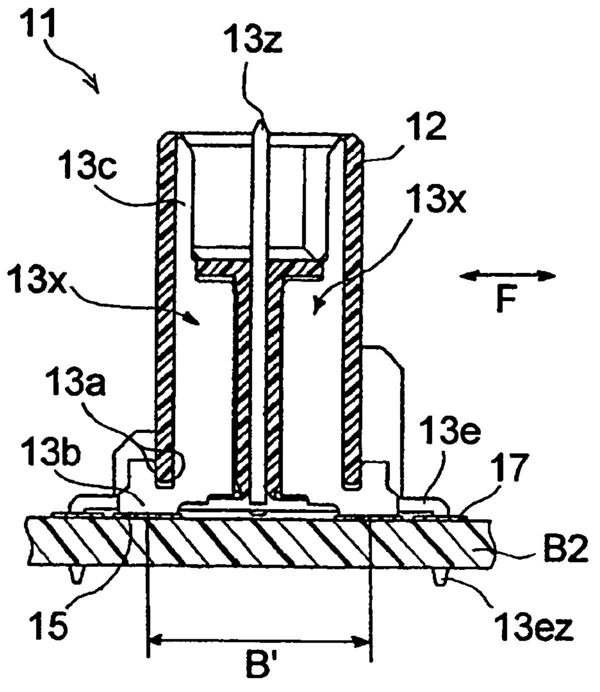
FIG. 4 is a cross-sectional view taken along line IV—IV in FIG. 6.

As illustrated in FIG. 4, two signal terminals 13*x* are arranged to form a pair (2 terminals) symmetrically in the width direction of the plug housing 12. Each signal terminal 13*x* comprises a fixing part 13*a* which clamps a wall part of the plug housing 12, a tail part 13*b* (hereinafter, referred to as the first tail part 13*b*) which is extended in the lateral direction from the lower end of the fixing part 13*a* so as to face toward the circuit board B2, and a contacting part 13*c* which is extended in the upper direction from the fixing part 13*a*.

The first tail part 13*b* is to be reflow-soldered to a land part 15 connected with a wiring pattern printed on the surface of the circuit board B2. As for the contacting part 13*c*, when the plug 11 is fitted into the socket 1 illustrated in FIG. 1, it makes contact with the contacting part 3*d* (cf. FIG. 2) of the signal terminal 3*x* on the socket 1 side.

Figure 5:
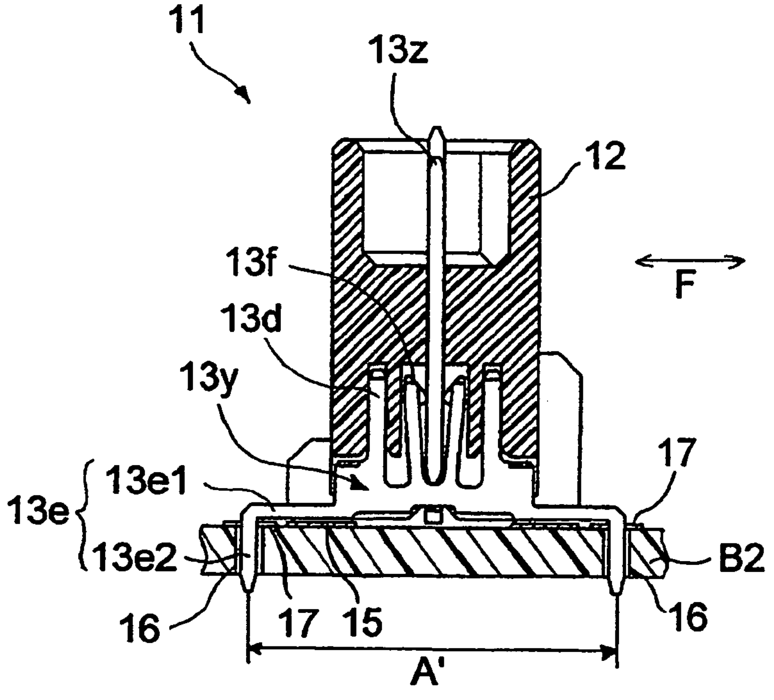
FIG. 5 is a cross-sectional view taken along line V—V in FIG. 6.

As illustrated in FIG. 5, two earth terminals 13*y* are formed integrally and symmetrically in the width direction of the plug housing 12. Each earth terminal 13*y* comprises a fixing part 13*d* which is press fitted into the groove formed on the plug housing 12, a tail part 13*e* (hereinafter referred to as the second tail part 13*e*) which is bent (toward the circuit board B2 side after extending in the lateral direction from the lower end of the fixing part 13*d*, and a contacting part 13*f* which is upwardly extended in the medial part of the lower end of the fixing part 13*d* and clamps the lower part of the earth plate 13*z*.

The second tail part 13*e* consists of an extending portion 13*e*1 and a leg portion 13*e*2, where the extending portion 13*e*1 is extended in the lateral direction of the plug housing 12 beyond the first tail part 13*b* of the signal terminal 13*x* and the leg portion 13*e*2 is formed so as to be bent on the circuit board B2 side from the top end of the extending portion 13*e*1. The leg portion 13*e*2 is inserted into a mounting hole 16 formed on the circuit board B2 and reflow-soldered to the other land part 17 formed on the surface of the circuit board B2. The other land part 17 is formed on the surface of the circuit board B2 surrounding the mounting hole 16.

As for the earth plate 13*z*, when the plug 11 is fitted into the socket 1 illustrated in FIG. 1, it is clamped with the contacting part 3*i* (cf FIG. 3) of the earth terminal 3*y* on the socket 1 side and makes contact with this contacting part 3*i*.

As described above, when the plug 11 is fitted into the socket 1 illustrated in FIG. 1, the contacting part 3*d* of the signal terminal 3*x* on the socket 1 side is press fitted and makes contact with the contacting part 13*c* of the signal terminal 13*x* on the plug 11 side, and the contacting part 3*i* of the earth terminal 3*y* on the socket 1 side clamps the earth plate 13*z* on the plug 11 side and makes contact with this earth plate 13*z*. Thereby, the circuit board B1, on which the socket 1 is mounted, is electrically connected with the circuit board B2, on which the plug 11 is mounted.

When the plug 11 is fitted into the socket 1, the earth plate 13*z* is arranged so as to divide the signal terminals 3*x* and 13*x* which are in the right and left sides in the width directions of the socket 1 and the plug 11. Thereby, the signal terminals 3*x* and 13*x* facing on the right and left sides each other are shielded with the earth plate 13*z*.

Further, every group of 10 signal terminals 13*x*, being adjacent in the longitudinal direction of the plug 11 are divided by the earth terminals 13*y*, making contact with the earth plate 13*z*. Thus, the shielding effect is exerted on every small block of 10 signal terminals 13*x* sandwiched between the earth terminals 13*y*.

Similarly, every group of 10 signal terminals 3*x*, adjacent in the longitudinal direction of the socket 1, are divided by the earth terminals 3*y*, making contact with the earth plate 13*z*. Thus, the shielding effect is exerted on every small block of 10 terminals 3*x* sandwiched between the earth terminals 3*y*.

Then, the mounting procedure of the socket 1 or the plug 11 on the circuit boards B1 and B2 will be described with reference to an example of the socket 1.

A cream solder is applied to each of the land parts 5 and 7, the mounting hole 6, and the land part of the metal fitting 4 of the circuit board B1. The first tail part 3*b* of the signal terminal 3*x* of the socket 1 and the metal fitting 4 are mounted on each land part. Further, the leg portion 3*g*2 of the second tail part 3*g* of the earth terminal 3*y* is inserted and loosely engaged into the mounting hole 6, and the cream solder is heated under this condition. Thereby, the solder is melted, and the tail parts 3*b* and 3*g* and the metal fitting 4 are closely adhered to each of the land parts 5 and 7 and the like. After the solder is cooled and solidified, the socket 1 is surface-mounted on the circuit board B1.

At this time, a part of the solder reflowed at the tail part 3*g* of the earth terminal 3*y* penetrates between the leg portion 3*g*2 and the mounting hole 6, and is solidified surrounding the leg portion 3*g*2. Further, the solder reflowed in the tail part 3*g* of the earth terminal 3*y* is solidified in the state adhered on the surface of the land part 7 so as to surround the mounting hole 6 by surface tension or the like. Thereby, the soldering area becomes larger than that of the first tail part 3*b* of the signal terminal 3*x* which is without the mounting hole 6.

In addition, as for the plug 11, the description will be omitted since it has a mounting structure similar to that of the above-mentioned socket 1 (the surface mounting type).

The operation of the present embodiment having the above structure will be described with respect the socket 1.

According to the above-mentioned mounting structure of the socket 1, as illustrated in FIG. 2, the first tail part 3*b* of the signal terminal 3*x* is reflow-soldered to the land part 5 of the surface of the circuit board B1. Thus, by having the land part 5 making contact with the first tail part 3*b* in itself made as small as possible, and the interval between the adjacent members of the land part 5 made as narrow as possible, the pitch x between the adjacent members of the signal terminal 3*x* can be made as narrow as possible.

Further, as illustrated in FIG. 3, the leg portion 3*g*2 of the second tail part 3*g* of the earth terminal 3*y* is inserted into the mounting hole 6 penetrating the other land part 7 of the surface of the circuit board B1 and reflow-soldered to this other land part 7 of the surface of the circuit board B1. Thus, the adhering area can be widely secured, and the solder penetrates into the mounting hole 6 to thereby increase the peeling strength.

Thereby, it is possible to narrow the pitch between the terminals and to increase the peeling strength simultaneously. That is, the mounting structure of the socket 1 having a small substrate occupying area and the high peeling strength can be realized.

Further, since each of the first tail part 3*b* and the second tail part 3*g* are fixed at each of the land parts 5 and 7 of the surface of the circuit board B1 by reflow-soldering, the whole of the socket 1 is surface-mounted on the circuit board B1 by reflow-soldering. Thus, it is not necessary to prepare the dip vessel, and the socket 1 can be mounted easily at low cost as compared with the case of using the dip type.

Further, in the example of the drawings, the second tail part 3*g* of the earth terminal 3*y* is bent on the circuit board B1 side after extended in the lateral direction from the first tail part 3*b* of the signal terminal 3*x*. Thus, the position of the mounting hole 6 formed on the circuit board B1 is deviated to the lateral direction from the position of the land part 5 formed on the circuit board B1 in order to make contact with the first tail part 3*b* of the signal terminal 3*x*, where the mounting hole 6 is formed in order to receive a leg portion 3*y*2 of the tail part 3*g* of the earth terminal 3*y*. Therefore, if the interval between the signal terminal 3*x* and the earth terminal 3*y* adjacent to the signal terminal 3*x* is narrowed, the land part 5 and the mounting hole 6 do not interfere each other, to thereby the pitch between the signal terminal 3*x* and the earth terminal 3*y* can be made as narrow as possible. Thereby, the progress to narrow the pitch between the terminals 3*x* and 3*y* can be made.

Further, since the second tail part 3*g* of the earth terminal 3*y* is extended in the lateral direction beyond the first tail part 3*b* of the signal terminal 3*x*, a mounting width A of the second tail part 3*g* of the earth terminal 3*y* to the circuit board B1 becomes larger than a mounting width B of the first tail part 3*b* of the signal terminal 3*x* to the circuit board B1. Thereby, when the force of the tip of a sheath (lateral force) F in the width direction is added to the socket housing 2, the large resistance moment can be exerted by the tail part 3*g* of the earth terminal 3*y*. In addition, the peeling strength is increased in combination with the leg portion 3*g*2 of the second tail part 3*g* being inserted into the mounting hole 6.

Further, in the example of the drawings, the second tail part 3*g* of the small number terminals of the earth terminal 3*y* are extended in the lateral direction beyond the first tail part 3*b* of the large number of terminals of the signal terminal 3*x*. Thus, the first tail part 3*b* having the large number of terminals of the signal terminal 3*x* is positioned on the inner side of the second tail part 3*g* having the small number of terminals of the earth terminal 3*y*, to thereby enable the substrate occupying area being as small as possible.

Further, in the case of the board-to-board type connector as illustrated in the drawings, a large stress is easily generated when connecting and disconnecting the socket 1 and the plug 11; hence while the high peeling strength is required, in the present embodiment, the progress to increase of the peeling strength can be made as mentioned above.

Further, in the case of the board-to-board type connector, it is desired to have the floating function for absorbing mounting errors. Thus, in the present embodiment, since the floating structure is used on the socket 1 side, the mounting errors can be absorbed.

In addition, though as mentioned above, the operation of the mounting structure of the socket 1 is described, as clearly understood from FIGS. 4 and 5, the mounting structure of the plug 11 is similar to that of the mounting structure of the socket 1. Thus, also in the mounting structure of the plug 11, there is the same operation effect as that of the mounting structure of the socket 1.

The embodiment of the present invention is not limited to the above-described type.

In the present embodiment, the second tail part 3*g* (13*e*) of the earth terminal 3*y* (13*y*) is extended in the lateral direction, and the leg portion 3*g*2 (13*e*2) of the top end is inserted into the mounting hole 6 (16) of the circuit board B1. However, the leg portion may be formed at a power supply terminal or a dummy terminal instead of the earth terminal 3y (13y). Further, a part of the plurality of terminals of the signal terminal 3x (13x) may be extended in the lateral direction with respect to the other part, to thereby form the leg portion.

Further, in the present embodiment, although the present invention is described for application of the board-to-board type connector between the boards, the present invention is not limited to this. If a connector is mounted on a circuit board, the present invention may be applied to the connector connected with a flat cable (a flexible cable), a coaxial cable or the like (the type described in Japanese Patent Laid-Open Publication No. H11-251010).

In addition, since the connector is provided between the boards in the present embodiment, it has a floating structure. However, if the connector is a type other than the connector provided between the boards, the floating structure is not necessary.

"Mounting Structure of Connector", which is described in the specification, claims, and drawings of the present invention, is indicated in Japanese Patent Application No. 2004-306861.

What is claimed is:

1. A mounting structure for mounting a connector on a circuit board, wherein said connector comprises a plurality of terminals arranged in a connector housing, wherein said terminals comprise first terminals separated with a predetermined pitch, and second terminals separated with a pitch larger than said predetermined pitch, wherein each of said first terminals has a first tail part facing toward said circuit board, and each of said second terminals has a second tail part bent toward said circuit board after extending in the lateral direction from said connector housing, wherein said first tail part is reflow-soldered to a land part formed on a surface of said circuit board, and a bent top end of said second tail part is inserted into a mounting hole penetrating another land part formed on the surface of said circuit board and reflow-soldered to said other land part.

2. The mounting structure of the connector according to claim 1, wherein said second tail part extends in the lateral direction from said connector housing beyond said first tail part.

3. The mounting structure of the connector according to claim 1, wherein said first terminals and said second terminals are each arranged in pairs across a width direction of said connector housing.

4. The mounting structure of the connector according to claim 1, wherein said first terminals are signal terminals and said second terminals are terminals other than the signal terminals.

5. The mounting structure of the connector according to claim 1, wherein said connector housing is a socket housing and/or a plug housing of a board-to-board type connector.

6. The mounting structure of the connector according to claim 1, wherein said connector housing comprises an outside housing formed to have a frame shape and an inside housing arranged in the medial part of said outside housing, wherein said inside housing is supported in a floating state with said outside housing through said first and second terminals.

7. A mounting structure for mounting a connector on a circuit board.

wherein said connector comprises a plurality of terminals arranged in a connector housing, wherein said terminals comprise first terminals separated with a predetermined pitch, and second terminals separated with a pitch larger than said predetermined pitch, wherein each of said first terminals has a first tail part facing toward said circuit board, and each of said second terminals has a second tail part bent toward said circuit board after extending in the lateral direction from said connector housing, wherein said first tail part is reflow-soldered to a land part formed on a surface of said circuit board, and a bent top end of said second tail part is inserted into a mounting hole penetrating another land part formed on the surface of said circuit board and reflow-soldered to said other land part, said second tail part extends in the lateral direction from said connector housing beyond said first tail part, and said first terminals and said second terminals are each arranged in pairs across a width direction of said connector housing.

8. The mounting structure of the connector according to claim 7, wherein said first terminals are signal terminals and said second terminals are terminals other than the signal terminals.

9. The mounting structure of the connector according to claim 8, wherein said connector housing is a socket housing and/or a plug housing of a board-to-board type connector.

10. The mounting structure of the connector according to claim 9, wherein said connector housing comprises an outside housing formed to have a frame shape and an inside housing arranged in the medial part of said outside housing, wherein said inside housing is supported in a floating state with said outside housing through said first and second terminals.

* * * * *